(12) United States Patent
Behzad (10) Patent No.: US 7,266,357 B2
(45) Date of Patent: Sep. 4, 2007

(54) REDUCED LOCAL OSCILLATOR FEEDTHROUGH QUADRATURE IMAGE REJECT MIXER

(75) Inventor: Arya Reza Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 520 days.

(21) Appl. No.: 10/436,191

(22) Filed: May 12, 2003

(65) Prior Publication Data
US 2004/0229589 A1 Nov. 18, 2004

(51) Int. Cl.
H04B 1/10 (2006.01)
(52) U.S. Cl. .................. 455/285; 455/192.2; 455/264; 455/302; 455/323
(58) Field of Classification Search ............ 455/192.1, 455/192.2, 283, 285, 296, 302, 313, 323, 455/326, 333, 334, 264; 327/113, 254, 359
See application file for complete search history.

(56) References Cited

U.S. PATENT DOCUMENTS

| | | | |
|---|---|---|---|
| 5,465,420 A * | 11/1995 | Dougherty et al. ......... 455/333 |
| 5,999,804 A | 12/1999 | Forgues | |
| 6,144,845 A * | 11/2000 | Durec ..................... 455/285 |
| 6,205,325 B1 * | 3/2001 | Groe ........................ 455/333 |
| 6,226,509 B1 | 5/2001 | Mole et al. | |
| 6,324,388 B1 | 11/2001 | Souetinov | |
| 6,429,721 B1 * | 8/2002 | Armitage et al. ........... 327/359 |
| 6,438,365 B1 * | 8/2002 | Balteanu ................... 455/326 |
| 6,865,382 B2 * | 3/2005 | Behzad ..................... 455/323 |
| 6,957,057 B2 * | 10/2005 | Das .......................... 455/333 |
| 2003/0003891 A1 * | 1/2003 | Kivekas et al. ............ 455/313 |

\* cited by examiner

Primary Examiner—Quochien B. Vuong (57) ABSTRACT

An RF communications circuit having a reduced LO feed through image reject mixer is disclosed. The image reject mixer includes a quadrature phase transconductance stage coupled to a quadrature phase mixer of a quadrature phase mixer module and an in-phase mixer of an in-phase mixer module. The image reject mixer further includes an in-phase transconductance stage coupled to an in-phase mixer of the quadrature phase mixer module and a quadrature phase mixer of the in-phase mixer module. The output of the quadrature phase mixer and in-phase mixer of the quadrature phase mixer module are cross-coupled to form a quadrature phase local oscillator (LO) output and wherein the output of the quadrature phase mixer and in-phase mixer of the in-phase mixer module are cross-coupled to form an in-phase local oscillator (LO) output.

4 Claims, 7 Drawing Sheets

REDUCED LOCAL OSCILLATOR FEEDTHROUGH QUADRATURE IMAGE REJECT MIXER

BACKGROUND

The present invention generally relates to radio frequency (RF) communications and more particularly relates to a system and a method for receiving and processing RF communications.

In conventional communications systems, data is transmitted by modulating a carrier signal at a frequency $f_c$ using any one of a number of well known modulation techniques. After receipt by the receiver antenna, the modulated signal is typically passed through a low noise amplifier for improved sensitivity. The signal next is either upconverted or downconverted using one or more mixing stages to a desired frequency which can be more easily processed.

The mixing taking place during up- or down-conversion mixes the received signal with a local oscillator (LO) signal at a desired local oscillator frequency $f_{lo}$. The result is multiple intermediate frequency (IF) signals, for example one at $f_c+f_{lo}$ and another at $f_c-f_{lo}$. One of these signals is the desired signal and the other is its image. The image, along with $f_{lo}$ and various subharmonics resulting from the mixing are filtered out, for example using preselection filtering. While this type of system if suitable for narrow band applications, it is not practical in wide band applications where the image could fall in the band of interest and appear as a legitimate signal.

In some wideband applications, image reject mixers are commonly used. In an image reject mixer, the incoming signal is mixed with the local oscillator signal and in parallel with the local oscillator signal shifted by ninety (90) degrees.

Conventionally the in-phase component (I) and the quadrature component (Q) are typically combined so as to produce constructive interference for the signal of interest and destructive interference for the unwanted image signal. Although quadrature down-conversion can improve the image rejection of a receiver, each transconductance stage and the baseband stages that drive the transconductance stages have DC offsets that add in root mean square fashion possibly resulting in a relatively large LO feedthrough.

SUMMARY OF THE INVENTION

In one aspect of the present invention an RF communications circuit includes a quadrature phase transconductance stage coupled to a quadrature phase mixer of a quadrature phase mixer module and an in-phase mixer of an in-phase mixer module. The image reject mixer further includes an in-phase transconductance stage coupled to an in-phase mixer of the quadrature phase mixer module and a quadrature phase mixer of the in-phase mixer module. The output of the quadrature phase mixer and in-phase mixer of the quadrature phase mixer module are cross-coupled to form a quadrature phase LO output and wherein the output of the quadrature phase mixer and in-phase mixer of the in-phase mixer module are cross-coupled to form an in-phase LO output.

In another aspect of the present invention an RF communications circuit includes a receiver coupled to a local oscillator, wherein the receiver receives an incoming RF signal and down-converts the incoming RF signal to baseband. The receiver then adjusts the frequency of the baseband signal based upon the quadrature phase and in-phase components of the local oscillator signal. In this aspect of the present invention the local oscillator includes an in-phase mixer module and a quadrature phase mixer module wherein the in-phase mixer module and the quadrature phase mixer module are coupled to a common quadrature phase transconductance stage and a common in-phase transconductance stage

BRIEF DESCRIPTION OF THE DRAWINGS

The present invention will become better understood with regard to the following description, appended claims, and accompanying drawings, in which:

DETAILED DESCRIPTION OF THE INVENTION

An exemplary embodiment of the present invention provides a quadrature image reject mixer with reduced LO feedthrough. Quadrature image rejection can improve the image rejection of a receiver. However, for optimum performance the in-phase and quadrature phase signal processing paths of an image reject mixer must be very-well matched in terms of gain and phase over the frequency range of the local oscillator. Gain and/or phase imbalance will result in incomplete image signal suppression, rendering a transceiver sensitive to unwanted image signals.

In addition, each of the transconductance stages typically used to provide the incoming RF signal to a mixer generates undesirable DC offset signals that are mixed with a signal from a voltage controlled oscillator (VCO) or phase lock loop (PLL) and translated in frequency by the mixers. Thus a quadrature image reject mixer may subject a receiver or transmitter to a number of additional undesirable signals. Consequently, a high precision IF filter may be required for the selection of the desired signal after frequency translation. This filter is often difficult to implement using integrated filter technologies especially if the IF is relatively high.

The generation of undesirable signals is exaggerated when both the in-phase and quadrature phase components of a translated frequency are required at the mixer output. In this instance the mixer stage should produce output signals at the following two frequencies:

$$F_{VCO\_I} + F_{BB\_I} \text{ or } F_{VCO\_I} - F_{BB\_I} \text{ (in-phase)}$$

$F_{VCO\_Q}+F_{BB\_Q}$ or $F_{VCO\_Q}-F_{BB\_Q}$ (quadrature-phase)

where $F_{BB\_I}$ and $F_{BB\_Q}$ are the frequencies of the in phase and quadrature phase components of the incoming baseband signal and $F_{VCO\_I}$ and $F_{VCO\_Q}$ are the frequencies of the in phase and quadrature phase components of a voltage controlled oscillator (VCO) signal. Typically four quad mixer cores and four transconductance stages would be used to generate the desired in phase and quadrature phase outputs as illustrated in block diagram form in FIG. 1.

Figure 1:
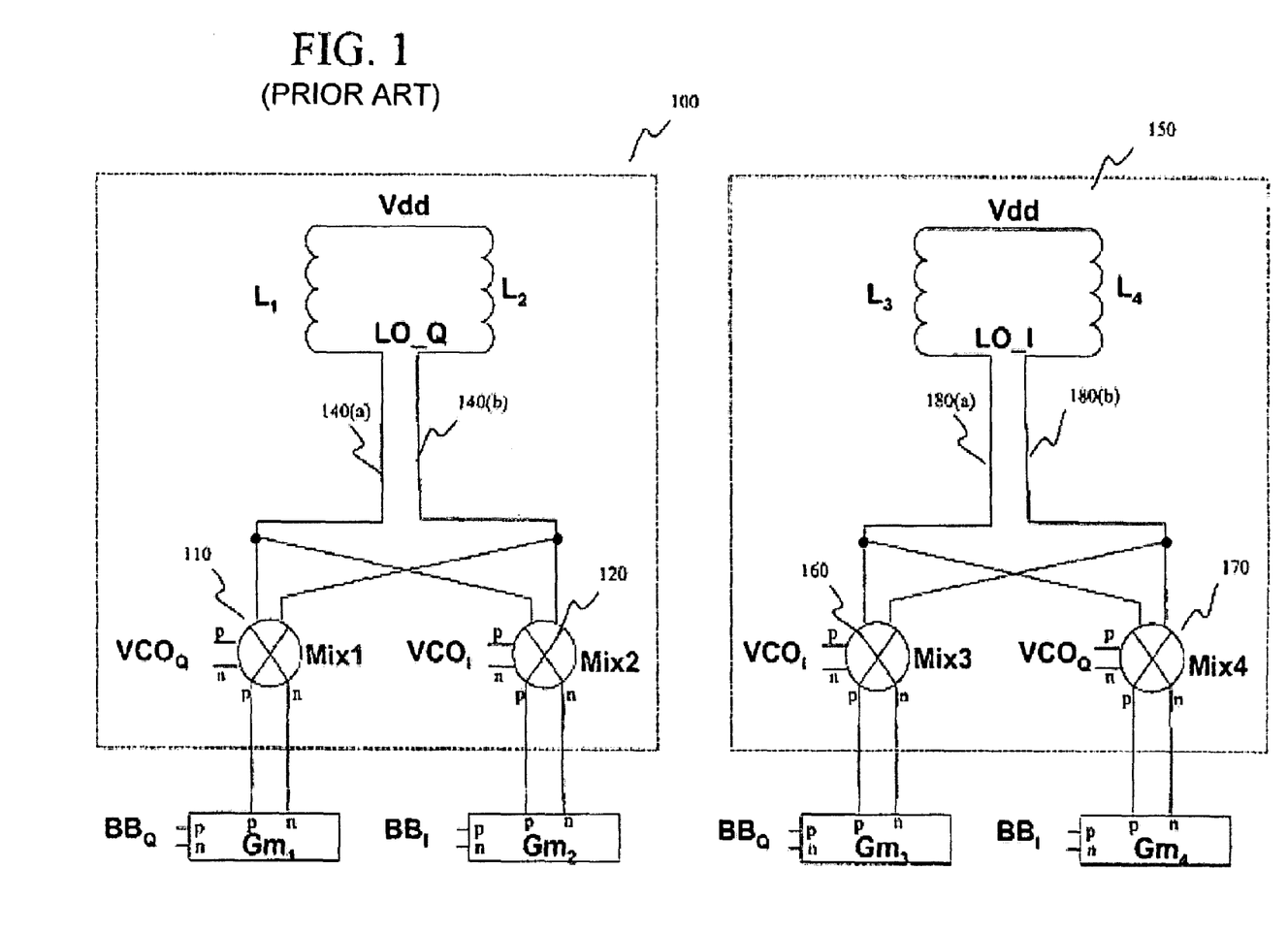
FIG. 1 is a simplified schematic diagram of a conventional image reject mixing stage.

In the illustrated embodiment, a quadrature mixing stage 100 comprises first and second mixers 110 and 120 coupled to a first pair of differential transconductance stages $Gm_1$ and $Gm_2$, respectively. The transconductance stages $Gm_1$ and $Gm_2$ receive the differential quadrature phase $BB_Q$ and in phase $BB_I$ components of the differential incoming baseband signal respectively. The transconductance stages $Gm_1$ and $Gm_2$ convert the differential quadrature phase and in-phase components of the incoming baseband signal from voltage signals to differential current signals. The differential quadrature phase and in phase currents are forwarded to differential mixers 110 and 120 respectively.

In the illustrated embodiment mixer 110 is driven by the quadrature phase component $VCO_Q$ of a differential VCO signal and mixer 120 is driven by the in-phase component $VCO_I$ of the differential VCO signal. Mixers 110 and 120 produce quadrature differential output signals given by $$\tfrac{1}{2} \sin(F_{VCO\_Q}+F_{BB\_Q})+\tfrac{1}{2} \sin(F_{VCO\_Q}-F_{BB\_Q}) \text{ and}$$

$$\tfrac{1}{2} \sin(F_{VCO\_Q}+F_{BB\_Q})-\tfrac{1}{2} \sin(F_{VCO\_Q}-F_{BB\_Q})$$

respectively, where a sine wave is used to represent a quadrature phase component signal and a cosine wave is used to represent an in-phase component signal. The differential outputs of mixers 110 and 120 are then summed together to produce a quadrature phase component 140a and 140(b) of a differential local oscillator output signal given by $\sin(F_{VCO\_Q}+F_{BB\_Q})$ that is applied to output inductive loads $L_1$ and $L_2$.

Similarly in-phase mixing stage 150 comprises a second pair of cross coupled mixers 160 and 170 coupled to a second pair of differential transconductance stages $Gm_3$ and $Gm_4$, respectively. The transconductance stages $Gm_3$ and $Gm_4$ receive the quadrature phase $BB_Q$ and in phase $BB_I$ components of the differential incoming baseband signal respectively. The transconductance stages $Gm_3$ and $Gm_4$ convert the differential quadrature phase and in-phase components of the incoming RF signal from voltage signals to differential current signals. The differential quadrature phase and in phase currents are forwarded to differential mixers 160 and 170 respectively In the illustrated embodiment mixer 160 is driven by the in phase component $VCO_I$ of the differential VCO signal and mixer 170 is driven by the quadrature phase component $VCO_Q$ of the differential VCO signal. In this instance mixers 160 and 170 produce differential output signals given by $$\tfrac{1}{2} \cos(F_{VCO\_I}+F_{BB\_I})+\tfrac{1}{2} \cos(F_{VCO\_I}-F_{BB\_I}) \text{ and}$$

$$\tfrac{1}{2} \cos(F_{VCO\_I}+F_{BB\_I})-\tfrac{1}{2} \cos(F_{VCO\_I}-F_{BB\_I})$$

respectively. The differential mixer outputs are then summed together to produce an in-phase components 180(a) and 180(b) of a differential local oscillator output signal equal to $\cos(F_{VCO\_Q}+F_{BB\_Q})$ that is applied to inductive loads $L_3$ and $L_4$. In the described exemplary embodiment the in-phase component of the local oscillator output signal is phase shifted by ninety degrees from the quadrature phase component of the local oscillator output signal.

Figure 2:
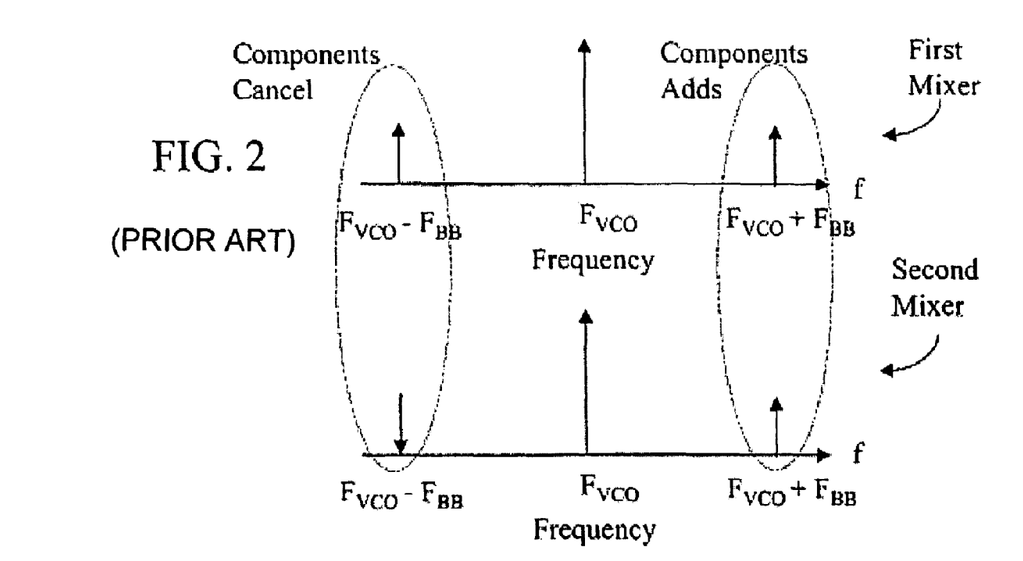
FIG. 2 graphically illustrate the operation of the mixer of FIG. 1.

FIG. 2 graphically illustrates the amplitude of the mixer output of the quadrature phase mixing stage as a function of frequency. More specifically, FIG. 2 illustrates the output of mixer 110 and the output of mixer 120, where downward facing arrows identify signals with negative amplitudes. As illustrated, the mixers output signals at frequencies equal to $(F_{VCO}+F_{BB})$ and $(F_{VCO}-F_{BB})$ which are symmetric about center frequency $F_{VCO}$. In the illustrated embodiment the signals at $F_{VCO}+F_{BB}$ constructively add where the signals at $(F_{VCO}-F_{BB})$ are opposite in magnitude and therefore destructively add, canceling each other out when summed.

Figure 3:
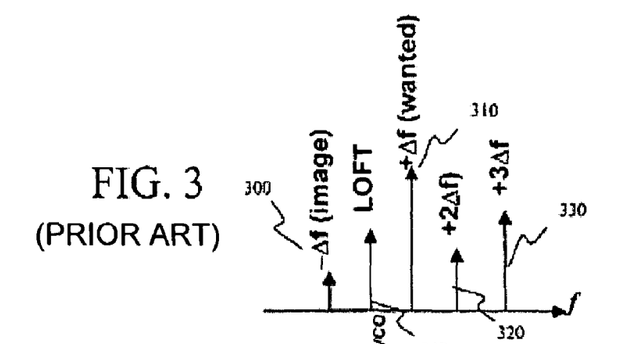
FIG. 3 graphically illustrates spurious signal that may be present in the signal band of the mixer of FIG. 1.

In operation however, the mixers may translate a number of spurious signals which may degrade the performance of the transceiver as illustrated in FIG. 3. For example, device mismatches between the in-phase and quadrature phase processing paths, in terms of gain and phase over the frequency range of the local oscillator, may result in the incomplete suppression of the image signal 300 rendering the transceiver sensitive to unwanted image signals. Similarly, system non-linearities may generate images at harmonics 320 and 330 of the desired signal 310.

In addition, process mismatches may create asymmetries between the positive and negative components of the differential baseband input signal relative to the common mode voltage. The process mismatches may create DC offsets that generate spurious LO feedthrough signals 340 that may further degrade the performance of the transceiver.

For example, the mixer stages should not generate an LO output signal when a baseband input signal is not being applied to the transconductance stages. However, process mismatches are typically such that the voltage of the positive differential baseband signal is, by way of example, larger than the common mode voltage and the voltage of the negative differential baseband signal is, by way of example, smaller than the common mode voltage.

In this instance a DC offset signal (i.e. a signal at DC), having a voltage equal to the difference between the voltage of the positive and negative differential baseband input signal components, is converted into a differential current signal by the transconductance stages and passed to the mixer stages. The mixers translate the DC offset signals in frequency to a frequency equal to the frequency of the $f_{VCO}$ signal that drives the mixers. The translated offset signals generated by each of the transconductance stages add in root mean square fashion and are applied as undesired spurious signals to the inductive loads.

Figure 4:
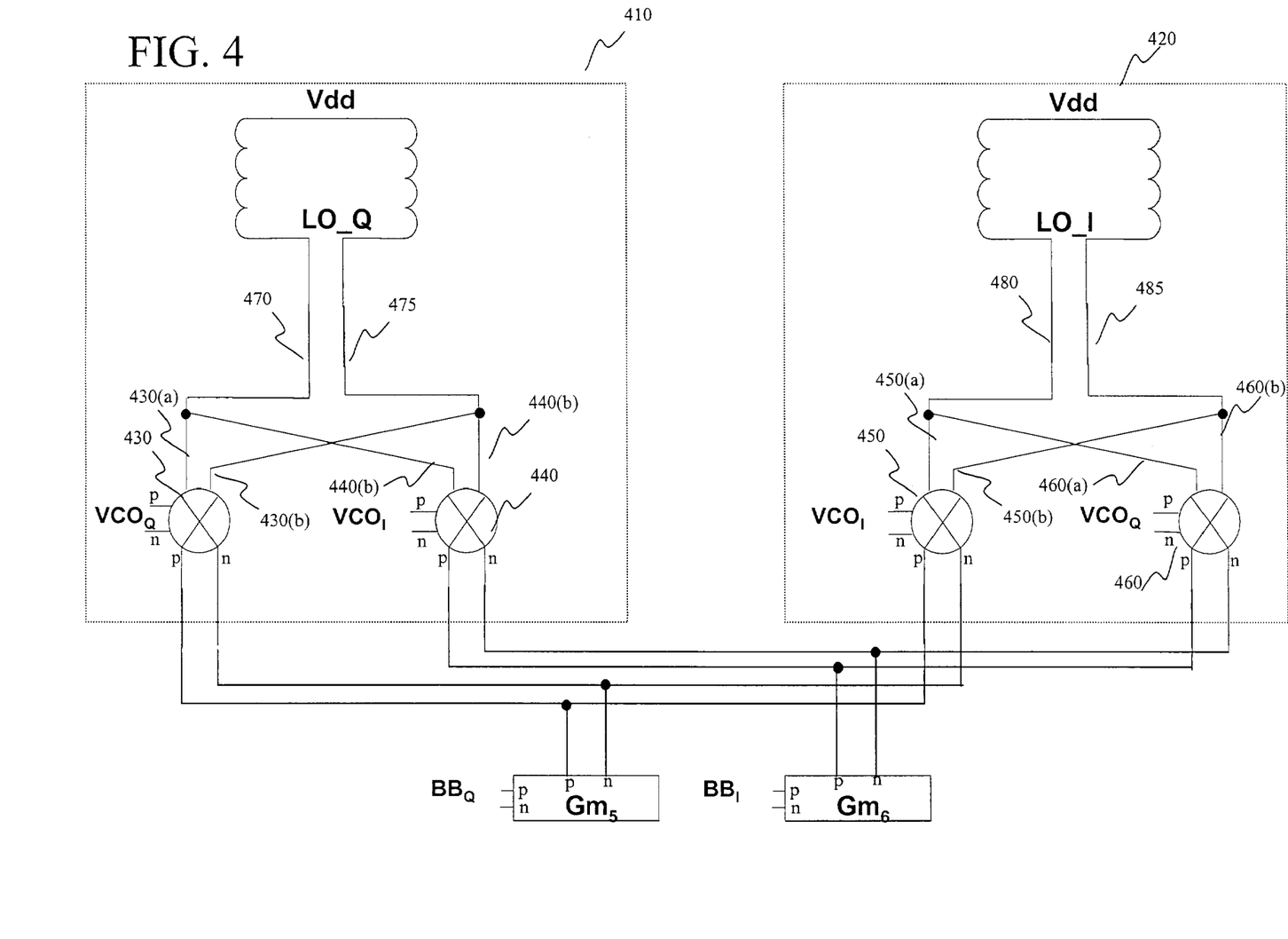
FIG. 4 is a simplified schematic diagram of a I and Q mixer having two transconductance stages that drive both the I mixer module and Q mixer module in accordance with an exemplary embodiment of the present invention.

Therefore, in an exemplary embodiment of the present invention two transconductance stages supply the necessary quadrature and in-phase differential currents to the quadrature phase and in-phase mixer stages. Referring to FIG. 4, in the described exemplary embodiment transconductance stages $Gm_5$ and $Gm_6$ are each coupled to both the quadrature phase mixer stage 410 and the in-phase mixer stage 420.

More specifically, in the described exemplary embodiment transconductance stage $Gm_5$ receives the quadrature phase component of the differential baseband input signal. Transconductance stage $Gm_5$ converts the differential quadrature phase component of the incoming baseband signal from a voltage signal to a differential current signal. The differential quadrature phase current is forwarded to a first mixer 430 of the quadrature phase mixer circuit as well as a first mixer 450 of the in phase mixer stage.

Similarly, transconductance stage $Gm_6$ receives the in-phase component of the differential baseband input signal. Transconductance stage $Gm_6$ converts the differential in-phase phase component of the incoming baseband signal from a voltage signal to a differential current signal. The differential in-phase current is to forwarded to a second mixer 440 of the quadrature phase mixer circuit as well as a second mixer 460 of the in-phase mixer stage. In the described exemplary embodiment, mixer 440 is driven by the in phase component of the differential VCO signal and mixer 460 is driven by the quadrature phase component of the differential VCO signal.

In the described exemplary embodiment, the positive 430(a) and negative 430(b) components of the differential output of mixer 430 are added with the positive 440(a) and negative 440(b) components of the differential output of mixer 440 to form the positive 470 and negative 475 components of the quadrature phase LO output. Similarly, the positive 450(a) and negative 450(b) components of the differential output of mixer 450 are summed with the positive 460(a) and negative 460(b) components of the differential output of mixer 460 to form the positive 480 and negative 485 components of the in-phase LO output.

The phasing sequence of the differential output currents of the two transconductance stages of the described exemplary embodiment replicates that of the conventional system having four transconductance stages. The described exemplary image reject mixer therefore generates the same quadrature phase and in phase differential local oscillator outputs at the frequency $F_{VCO}+F_{BB}$ as previously described with respect to FIG. 2.

Thus the described exemplary embodiment eliminates half of the transconductance stages as compared to conventional designs. Further, the elimination of two transconductance and the DC offsets associated with them results in a square root of two reduction in the total level of DC offsets (assuming DC offsets are dominated by the Gm stages) in the mixer outputs and a corresponding reduction in LO feedthrough.

Figure 5:
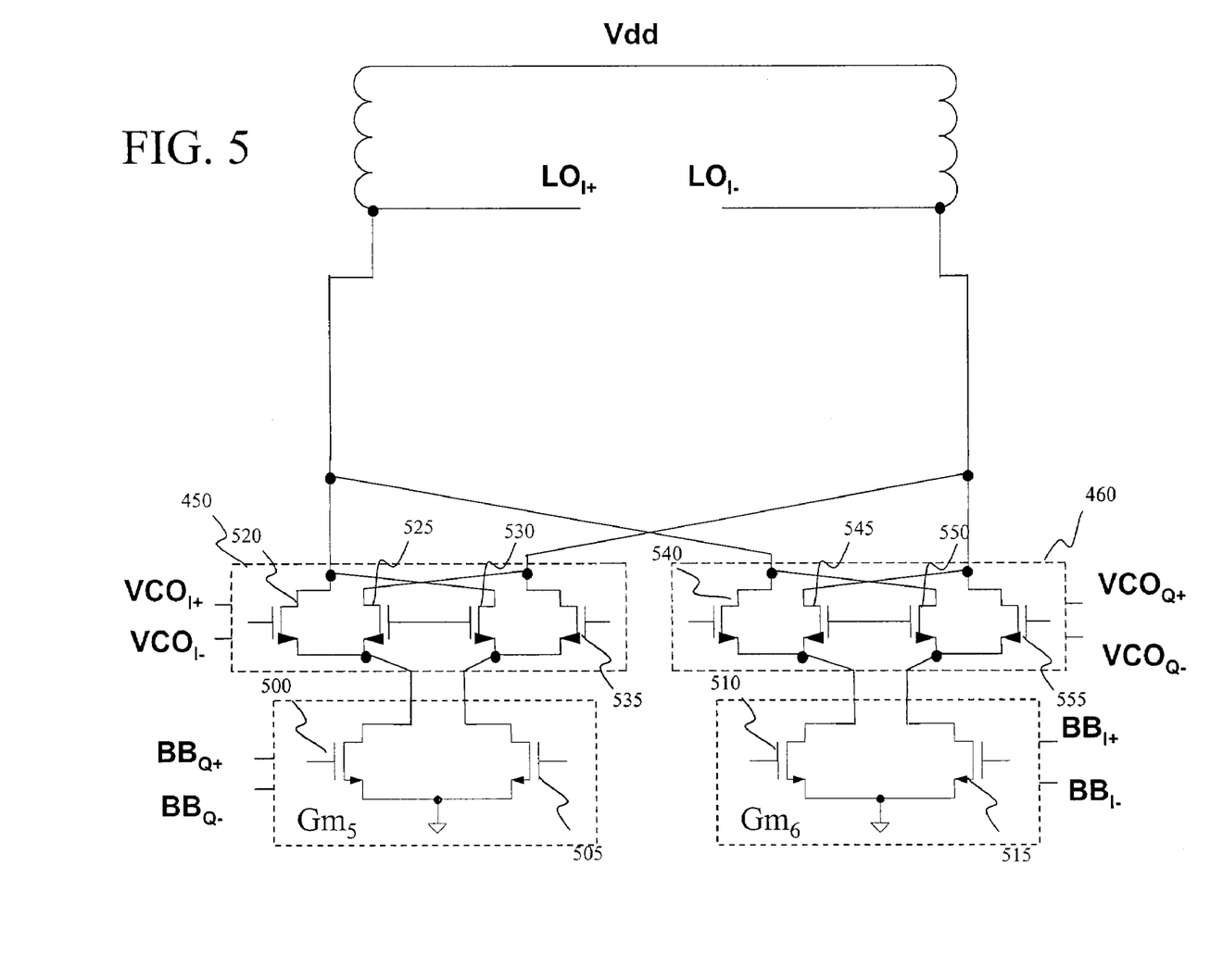
FIG. 5 is a circuit diagram of the I mixer module of the mixer of FIG. 4 in accordance with an exemplary embodiment of the present invention.

FIG. 5 is a simplified circuit level schematic of the in-phase side of the image reject mixer of FIG. 4. The in-phase and quadrature phase sides of the image reject mixer are, by way of example double balanced switching mixers coupled to differential transistor pairs 500/505 and 510/515 which form transconductance stages $Gm_5$ and $GM_6$ respectively. In the illustrated embodiment transistors 500-515 as well as other transistors described hereinafter are field effect transistors (FETs). One of skill in the art will appreciate that the FETS can be Metal-Oxide-Semiconductor field effect transistors (MOSFETS) can be silicon junction field effect transistors, gallium arsenide field effect transistors (GaAsFET), metallic semiconductor field effect transistors (MESFET), pseudomorphic high electron mobility transistors (PHEMT).

In addition, the present invention is not limited to FETs. Rather, the present invention may be implemented with other transistors known in the art, such as for example, npn bipolar junction transistors (BJTs), pnp hetero bipolar transistors (HBTs), or the like.

In the described exemplary embodiment the differential pairs of transistors in the transconductance stages drive mixer quad transistor cores 450 and 460 respectively. In the described exemplary embodiment mixer quad transistor cores 450 and 460 each include cross-coupled pairs of differential transistors 520-535 and 540-555 respectively.

In FIG. 5, the quadrature phase of the differential RF input signal is coupled into the gates of the differential pair of FETs 500 and 505 of transconductance stage $GM_5$. In this embodiment the negative component of the RF signal coupled to the gate of FET 505 is 180 degrees out of phase with the positive component of the RF signal coupled to the gate of FET 500. Similarly, the gates of MOS FETs 510 and 515 are coupled to the positive and negative components of the in-phase component of the differential RF signal. Further, the sources of each pair of differential transistors are coupled together and to ground.

The positive and negative components of the differential output current generated by differential pair 500 and 505 are coupled to the mixer quad transistor core 450 at the sources of the differential pairs of transistors 520/525 and 530/535 respectively. Likewise, the positive and negative components differential output current generated by the differential pair 510/515 are coupled to the mixer quad transistor core 460 at the sources of the differential pairs of transistors 540/545 and 550/555 respectively.

In the described exemplary embodiment the positive component of the in-phase differential VCO signal to be mixed with the differential baseband signal is coupled to the gates of transistors 520 and 535 and the negative component is coupled to the gates of transistors 525 and 530 Further, the positive component of the quadrature phase differential VCO signal to be mixed with the differential baseband signal is coupled to the gates of transistors 540 and 555 and the negative component is coupled to the gates of transistors 545 and 550.

In this embodiment, the drains of transistors 520/530 and 540/550 are coupled to form the positive output of the in-phase component of the LO output signal. Likewise the drains of transistors 525/535 and 545/555 are coupled to form the negative output of the in-phase component of the LO output signal.

In operation, the baseband signal is converted from voltage to current by transconductance stages $Gm_5$ and $Gm_6$. In operation, the in-phase and quadrature phase components of the differential VCO signal control the on-off cycles of transistors 520-535 and 540-555 respectively. The mixer cores 450 and 460 therefore switch the output current of the transconductance stages at the frequency $f_{VCO}$ of the VCO signal. The switched current produces a local oscillator at the differential outputs LO– and LO+, having a frequency given by the following equation:

$$F_{LO}=F_{VCO}+F_{BB}$$

as described with respect to FIG. 2.

Figure 6:
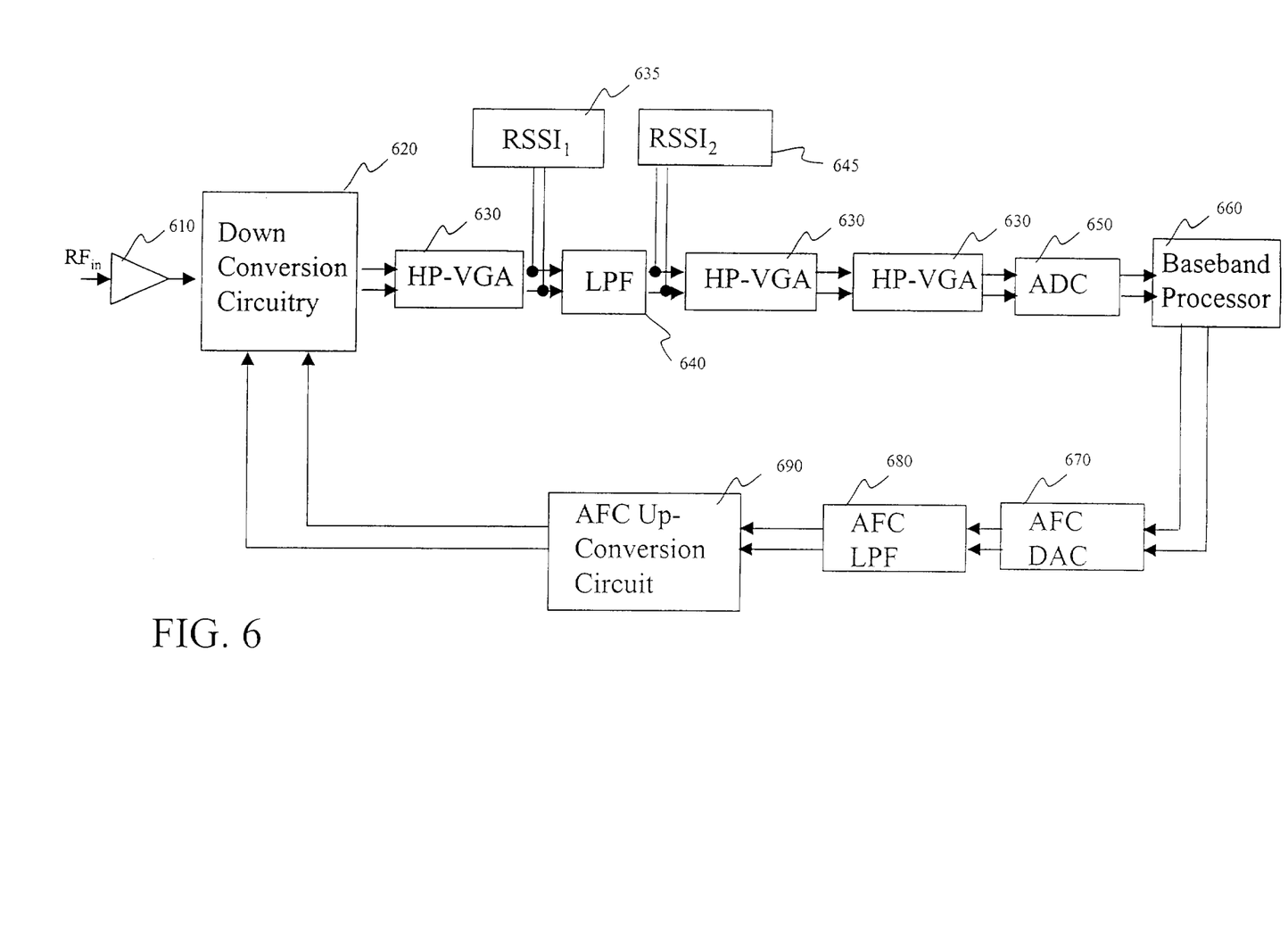
FIG. 6 is a simplified block diagram of a receiver incorporating the mixer of FIG. 4 in accordance with an exemplary embodiment of the present invention.

The advantages of the present invention may best be understood in the context of an illustrative application. FIG. 6 is a functional block diagram of a receiver formed according to one embodiment of the present invention. In the illustrated embodiment, the receiver 600 includes low noise amplifier 610 that receives an incoming RF signal and forwards an amplified RF signal to down-conversion circuitry 620 that converts the amplified RF signal from the RF to baseband in response to in-phase and quadrature phase components of a local oscillator signal provided by an automatic frequency control (AFC) circuit 690. The described exemplary embodiment further includes one or more high pass variable gain amplifiers (HP-VGA's) 630 that amplify the signal as it is being processed. Receiver 600 further include one or more low pass filters 640 that remove out of band interference from the received signal.

An analog to digital converter 650 then converts the in-phase and quadrature phase components of the received RF signal from an analog to a digital format. An exemplary embodiment, further includes, by way of example, one or more RSSIs 635 and 645 that sense the power of the signal, as well as the signal plus interference. A baseband processor 660 then determines the ratio of the RSSI measured power levels to determine the relative gain adjustments of the amplification stages. The baseband processor 660 may also vary RC time constants of various filters, such as, for example, low pass filter 640.

An AFC digital to analog converter 670 converts the gain adjusted digital in-phase and quadrature phase components of the received signal back to an analog format. An AFC low pass filter 680 filters the analog signal to remove out of band noise and forwards the in-phase and quadrature phase components of the AFC signal to the AFC up-conversion circuit 690. The AFC up-conversion circuit 690 up-converts the baseband AFC signal as required to provide the in-phase and quadrature phase local oscillator control signals to the down conversion circuitry 620.

Figure 7:
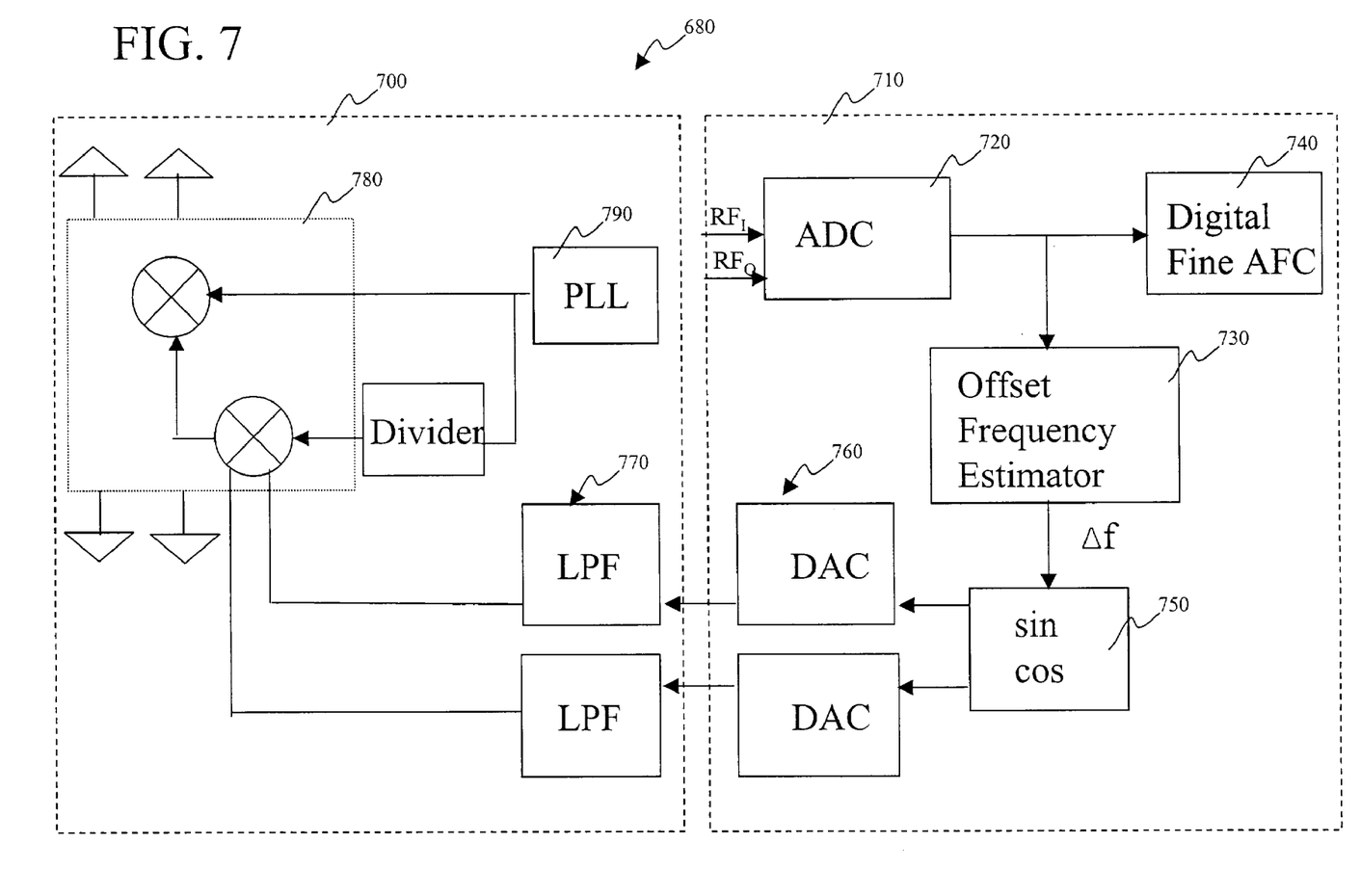
FIG. 7 is a simplified schematic diagram of an automatic frequency controller in accordance with an exemplary embodiment of the present invention.

FIG. 7 is a functional block diagram of an AFC circuit formed according to one described embodiment of the present invention. The described exemplary AFC circuit comprises an RF signal processor 700 for adjusting the frequency of the LO signal coupled to a baseband signal processor 710 that determines the difference in center channel frequencies between the received RF signal and the expected center channel frequency of the received RF signal.

In the described exemplary embodiment the received RF signal is down-converted and coupled to an analog to digital converter (ADC) 720 that converts the down-converted RF signal from an analog to a digital format. The ADC is coupled to an offset-frequency estimator 730 that uses the data pilot tones to estimate the frequency offset to a coarse degree of resolution.

In an exemplary embodiment a digital frequency controller 740 performs high resolution measurements of the frequency difference in the digital domain and correct for fine frequency offsets directly in the digital domain. Offset-frequency estimator 730 produces a signal defining the difference in center channel frequency for the received RF signal and the expected value to a signal generator 750. It is understood that the pilot signal is transmitted as part of standard network communication protocols for signal control and synchronization.

Signal generator 750 generates quadrature phase (I and Q) outputs for the difference signal (reflecting a frequency adjustment amount) to a pair of digital to analog converters (DACs) 760 which pass analog outputs to a pair of low pass filters 770 which remove out of band signals. The filtered I and Q components are coupled to an exemplary mixer 780 that also receives an input from a phase lock loop 790 to produce a received RF signal having a specified center channel frequency. It is understood that the mixer 780 (including the PLL) further receives control signals from a baseband processor (not shown) specifying the expected center channel frequency.

Figure 8:
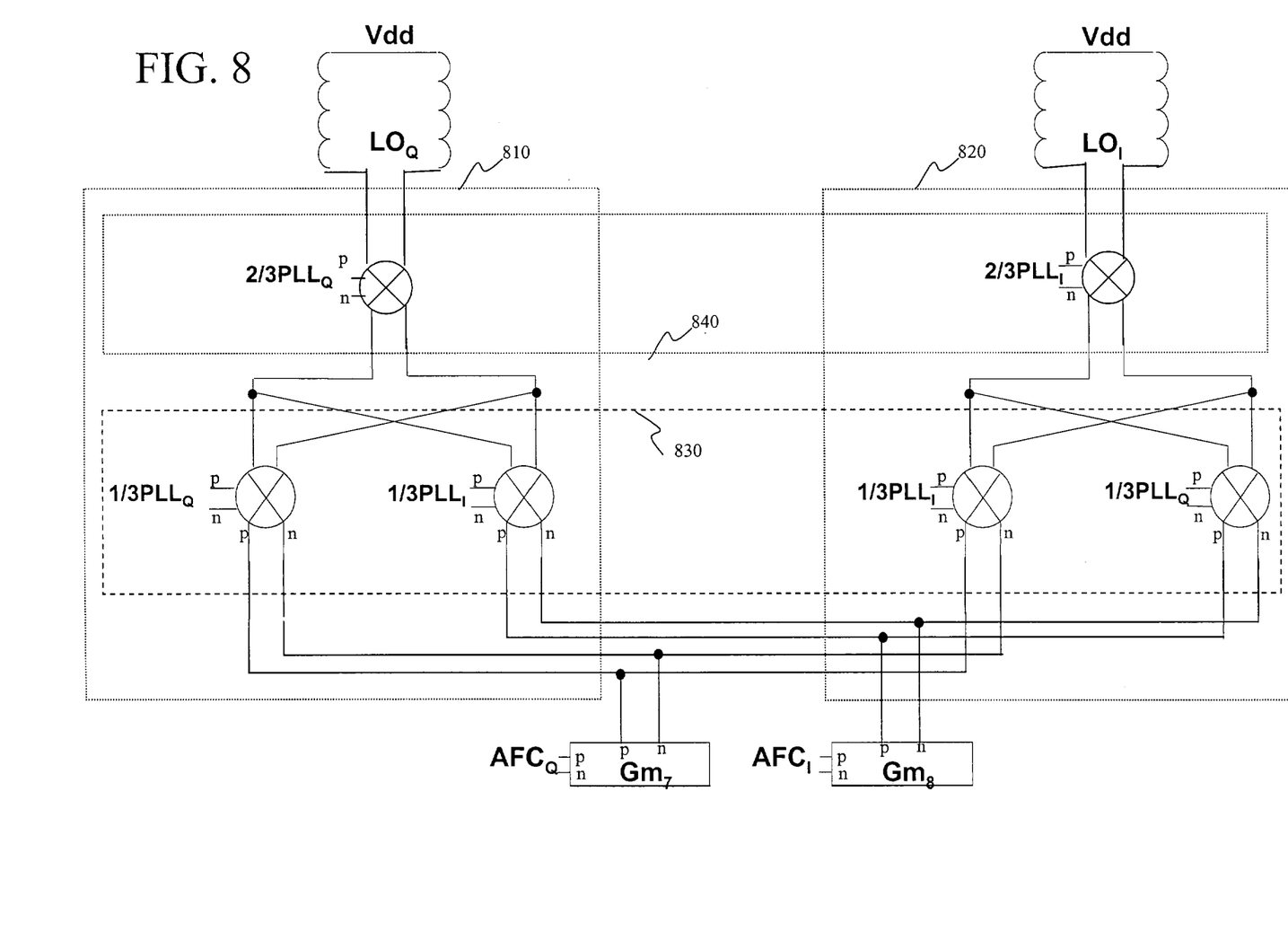
FIG. 8 is a simplified schematic of a frequency correction stage in accordance with an exemplary embodiment of the present invention.

FIG. 8 is a functional block diagram of the described exemplary mixer comprising a Q component frequency corrected mixer module 810 and an I component mixer module 820. In the described exemplary embodiment the I and Q frequency corrected mixer modules each comprise a first mixing stage 830 having two quad mixer cores coupled to two transconductance stages as previously described with respect to FIG. 4. In the described exemplary embodiment the transconductance stages $Gm_7$ and $Gm_8$ receive the in-phase and quadrature phase components of the differential automatic frequency corrected signal ($AFC_I$ and $AFC_Q$) and forward corresponding output currents to both the I and Q frequency corrected mixer modules as previously described with respect to FIG. 4. In the described exemplary embodiment the frequency corrected currents are mixed with I and Q components of the phase lock loop. In one embodiment of the present invention the phase lock loop oscillation signals that are received by the I and Q mixer modules in the first mixing stage 830 are divided by a factor such as for example, three to mitigate pulling by the local oscillator.

In the described exemplary embodiment the differential outputs of the I and Q mixer modules in the first mixer stage are forwarded to I and Q mixer modules in a second mixer stage 840 where they are mixed with an uncompensated local oscillation signal to produce the desired output frequency. For example, in the illustrated embodiment the uncompensated local oscillation signal is at a frequency equal to $\frac{2}{3}$ the desired frequency.

Therefore, the frequency of the differential I and Q outputs of the described exemplary mixer correspond to the sum of the frequency of the frequency corrected signal, the frequency of the divided PLL signal and the frequency of the uncompensated local oscillation signal as follows:

$$F_{LO} = F_{AFC} + \tfrac{1}{3}F_{PLL} + \tfrac{2}{3}F_{PLL} = F_{AFC} + F_{PLL}$$

The invention described herein will itself suggest to those skilled in the various arts, alternative embodiments and solutions to other tasks and adaptations for other applications. It is the applicant's intention to cover by claims all such uses of the invention and those changes and modifications that could be made to the embodiments of the invention herein chosen for the purpose of disclosure without departing from the spirit and scope of the invention.

What is claimed is:

1. An RF communications circuit comprising:
a receiver coupled to a local oscillator, wherein the receiver is adapted to receive an incoming RF signal and adjust a frequency of an incoming RF signal based upon quadrature phase and in-phase components of the local oscillator signal and wherein the local oscillator comprises an in-phase mixer module and a quadrature phase mixer module and wherein the in-phase mixer module and the quadrature phase mixer module are coupled to a common quadrature phase transconductance stage and a common in-phase transconductance stage, wherein the quadrature phase transconductance stage is adapted to receive a quadrature phase component of an automatic frequency correction signal and wherein the in-phase transconductance stage receives an in-phase component of the automatic frequency correction signal.

2. The RF communications circuit of claim 1 wherein the quadrature phase mixer module is adapted to correct a frequency of a quadrature phase component of a voltage controlled oscillator signal as a function of the automatic frequency correction signal.

3. The RF communications circuit of claim 2 wherein the in-phase mixer module is adapted to correct a frequency of an in-phase component of a voltage controlled oscillator signal as a function of the automatic frequency correction signal.

4. The RF communications circuit of claim 3 further comprising a baseband processor adapted to generate the automatic frequency correction signal as a function of a difference in a center channel frequency of the incoming RF signal and an expected center channel frequency of the incoming RF signal.

* * * * *